United States Patent
Cone (10) Patent No.: US 10,788,749 B2
(45) Date of Patent: Sep. 29, 2020

(54) SYSTEM AND METHOD FOR IMPROVING THE THROUGHPUT OF A NANOIMPRINT SYSTEM

(71) Applicant: CANON KABUSHIKI KAISHA, Tokyo (JP)

(72) Inventor: Craig William Cone, Austin, TX (US)

(73) Assignee: CANON KABUSHIKI KAISHA (JP)

( * ) Notice: Subject to any disclaimer, the term of this patent is extended or adjusted under 35 U.S.C. 154(b) by 205 days.

(21) Appl. No.: 15/827,898

(22) Filed: Nov. 30, 2017

(65) Prior Publication Data

US 2019/0163052 A1    May 30, 2019

(51) Int. Cl.
  *G03F 7/00*  (2006.01)
  *G03F 7/20*  (2006.01)
  *G03F 9/00*  (2006.01)
  *B82Y 40/00* (2011.01)

(52) U.S. Cl.
  CPC ............ *G03F 7/0002* (2013.01); *G03F 7/707* (2013.01); *G03F 7/7065* (2013.01); *G03F 7/7085* (2013.01); *G03F 9/7003* (2013.01); *G03F 9/7042* (2013.01); *B82Y 40/00* (2013.01)

(58) Field of Classification Search
  None
  See application file for complete search history.

(56) References Cited

U.S. PATENT DOCUMENTS

| | | | |
|---|---|---|---|
| 6,932,934 B2 | 8/2005 | Choi et al. | |
| 6,936,194 B2 | 8/2005 | Watts | |
| 7,157,036 B2 | 1/2007 | Choi et al. | |
| 7,396,475 B2 | 7/2008 | Sreenivasan et al. | |
| 8,066,930 B2 | 11/2011 | Sreenivasan | |
| 8,076,386 B2 | 12/2011 | Xu et al. | |
| 8,349,241 B2 | 1/2013 | Sreenivasan et al. | |
| 9,703,190 B2 | 7/2017 | Hayashi | |

(Continued)

FOREIGN PATENT DOCUMENTS

| | | | |
|---|---|---|---|
| JP | 2012-169537 A | 9/2012 | |
| JP | 2013-219333 A | 10/2013 | |

(Continued)

OTHER PUBLICATIONS

Introduction to NanoPoint, 2013, KLA-Tencor Corporation, Milpitas, CA.

*Primary Examiner* — Joshua D Zimmerman
(74) *Attorney, Agent, or Firm* — Daniel Ratoff (57) ABSTRACT

An imprinting method and system in which, a template is imprinted onto formable material at a plurality of locations on a substrate. A template filling time varies among the plurality of locations. The template filling time for each of the locations is determined prior to applying the formable material to the substrate. The template is aligned to the substrate each time the template is imprinted onto the formable material during an alignment convergence period that is determined to have completed when real time alignment data indicates that alignment of the template and the substrate is within specified limits. The alignment convergence period and the template filing period overlap. Curing the formable material in the template at each of the plurality of locations after both the alignment convergence period has completed and the template filing period has expired.

17 Claims, 8 Drawing Sheets

(56) References Cited

U.S. PATENT DOCUMENTS

| | | | | |
|---|---|---|---|---|
| 2012/0205782 A1* | 8/2012 | Asano | ............... | G03F 7/0002 |
| | | | | 257/618 |
| 2015/0013559 A1* | 1/2015 | Hayashi | ............ | G03F 7/0002 |
| | | | | 101/450.1 |
| 2016/0136872 A1 | 5/2016 | Yanagisawa | | |
| 2017/0185074 A1 | 6/2017 | Asada et al. | | |

FOREIGN PATENT DOCUMENTS

| | | |
|---|---|---|
| JP | 2017-118057 A | 6/2017 |
| JP | 2017-147414 A | 8/2017 |

\* cited by examiner

SYSTEM AND METHOD FOR IMPROVING THE THROUGHPUT OF A NANOIMPRINT SYSTEM

BACKGROUND

Field of Art

The present disclosure relates to systems and methods for controlling the throughput of a nanoimprint system.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication provides for greater process control and/or improved throughput while also allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating one or more layers of integrated devices such as CMOS logic, microprocessors, NAND Flash memory, NOR Flash memory, DRAM memory, MRAM, 3D cross-point memory, Re-RAM, Fe-RAM, STT-RAM, and the like. Exemplary nanoimprint lithography processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the formation of a relief pattern in a formable material (polymerizable) layer and transferring a pattern corresponding to the relief pattern into and/or onto an underlying substrate. The patterning process uses a template spaced apart from the substrate and a formable liquid applied between the template and the substrate. The formable liquid is solidified to form a solid layer that has a pattern conforming to a shape of the surface of the template that contacts the formable liquid. After solidification, the template is separated from the rigid layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device fabrication, including, for example, oxidation, film formation, deposition, doping, planarization, etching, formable material removal, dicing, bonding, and packaging, and the like.

US Patent Publication No. 2016/0136872 by Masakatsu YANAGISAWA (hereinafter Yanagisawa) discloses an imprint apparatus that aligns a mold and substrate by detecting marks provided on each. Yanagisawa discloses an apparatus in which if there is an abnormality in the mark detection a recovery process is selected. Yanagisawa discloses that in order to prevent an occurrence of an unfilled pattern the filling time is predetermined to ensure that the mold is sufficiently filled with resin.

Improving the throughput while maintaining quality has an impact on the usefulness of imprint lithography processes. When employing a drop dispense method of applying the polymerizable material to the substrate, the imprint process cycle may consist of: (1) dispensing droplets of polymerizable material onto a substrate; (2) bringing a nanoimprint template into contact with these droplets such that the droplets spread and fill the patterning surface of the template; (3) solidifying the polymerizable material, and (4) separating the template from the substrate. This process leaves a solidified layer having a relief image of the template pattern on the substrate surface. Improving the throughput of this process requires reducing the cycle time of one or more these processes.

Step (2) above of the imprint lithography process is time limited by the alignment time and the filling time. The filling time is a time period associated with the spreading and filling of the template pattern features with the polymerizable material. One method of improving the throughput is to reduce the filling time. If the filling time is reduced by too much then the defect rate goes up. What is needed is a way to reduce the filling time while preventing an increase in the defect rate.

SUMMARY

At least a first embodiment, may be an imprinting method. The imprinting method may comprise applying a formable material to a substrate. The imprinting method may comprise imprinting a template onto the formable material at a plurality of locations on the substrate. A template filing period may be a period of time that the formable material takes to fill the template. The template filling time may vary among the plurality of locations on the substrate. The template filling time for each of the plurality of locations may be determined prior to applying the formable material to the substrate. The template may be aligned to the substrate each time the template is imprinted onto the formable material during an alignment convergence period. The alignment convergence period may be determined to have completed when real time alignment data indicates that alignment of the template and the substrate is within specified limits. The alignment convergence period and the template filing period may overlap. The imprinting method may comprise curing the formable material in the template at each of the plurality of locations after both the alignment convergence period has completed and the template filing period has expired.

In an aspect of the first embodiment, the substrate may be a wafer.

In an aspect of the first embodiment, curing the formable material may include exposing the formable material to actinic radiation.

An aspect of the first embodiment, may further comprise analyzing the formable material on the substrate after the formable material has been cured to determine the defect density for each of the plurality of locations.

An aspect of the first embodiment, may further comprise increasing the template filing time at a particular location among the plurality of locations if the defect density for the particular location is above a first threshold.

An aspect of the first embodiment, may further comprise decreasing the template filing time at a particular location among the plurality of locations if the defect density for the particular location is below a second threshold.

An aspect of the first embodiment, may further comprise adjusting the template filing time at a particular location among the plurality of locations if the defect density for the particular location is outside a first range.

In an aspect of the first embodiment, the real time alignment data may converge to values that are within the specified limits.

In an aspect of the first embodiment, the real time alignment data may include values representative of each of three directional axes and three rotational axes.

In an aspect of the first embodiment, the real time alignment data may be reduced to a single magnitude.

An aspect of the first embodiment, may further comprise analyzing the formable material on the substrate after the formable material has been cured to determine the yield for each of the plurality of locations.

An aspect of the first embodiment, may further comprise adjusting the template filing time at a particular location among the plurality of locations such that a multiple of both a predicted yield and a predicted throughput is greater than a pervious yield and a previous throughput.

An aspect of the first embodiment, may further comprise adjusting the template filing time at a particular location among the plurality of locations such that both a predicted yield is greater than a pervious yield and a predicted throughput is greater than a previous throughput.

At least a second embodiment, may be a method of manufacturing an article with an imprinting apparatus. The imprinting method may comprise applying a formable material to a substrate. The imprinting method may comprise imprinting a template onto the formable material at a plurality of locations on the substrate. A template filing period may be a period of time that the formable material takes to fill the template. The template filling time may vary among the plurality of locations on the substrate. The template filling time for each of the plurality of locations may be determined prior to applying the formable material to the substrate. The template may be aligned to the substrate each time the template is imprinted onto the formable material during an alignment convergence period. The alignment convergence period may be determined to have completed when real time alignment data indicates that alignment of the template and the substrate is within specified limits. The alignment convergence period and the template filing period may overlap. The imprinting method may comprise curing the formable material in the template at each of the plurality of locations after both the alignment convergence period has completed and the template filing period has expired.

At least a third embodiment, may be an imprinting apparatus controller comprising: a memory; and a processor configured to send instructions to an imprinting apparatus. The imprint apparatus may apply a formable material to a substrate. The imprint apparatus may imprint a template onto the formable material at a plurality of locations on the substrate. A template filing period may be a period of time that the formable material takes to fill the template. The template filling time may vary among the plurality of locations on the substrate. The template filling time for each of the plurality of locations may be determined prior to applying the formable material to the substrate and may be stored in the memory. The template may be aligned to the substrate each time the template is imprinted onto the formable material during an alignment convergence period. The alignment convergence period may be determined to have completed when real time alignment data received by the processor indicates that alignment of the template and the substrate is within specified limits. The alignment convergence period and the template filing period may overlap. The imprint apparatus may cure the formable material in the template at each of the plurality of locations after both the alignment convergence period has completed and template filing period has expired.

At least a fourth embodiment, may be a method of imprinting. The imprinting method may comprise preparing a template having a patterning surface. The imprinting method may comprise preparing a substrate. The imprinting method may comprise contacting a formable material applied to a first field of the substrate with the patterning surface. The first field may be large enough to transfer an entire pattern of the template. The imprinting method may comprise curing the formable material applied to the first field contacted with the template in response to an expiration of a first filling period. The imprinting method may comprise contacting the formable material applied to a second field of the substrate with the patterning surface, wherein the second field is not large enough to transfer the entire pattern of the template. The imprinting method may comprise curing the formable material applied to the second field contacted with the template in response to an expiration of a second filling period. The first filling period and the second filling period are different.

In an aspect of the fourth embodiment, the second filling period is longer than the first filling period.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

What is needed is a way to reduce the filling time while preventing an increase in the defect rate.

Figure 1:
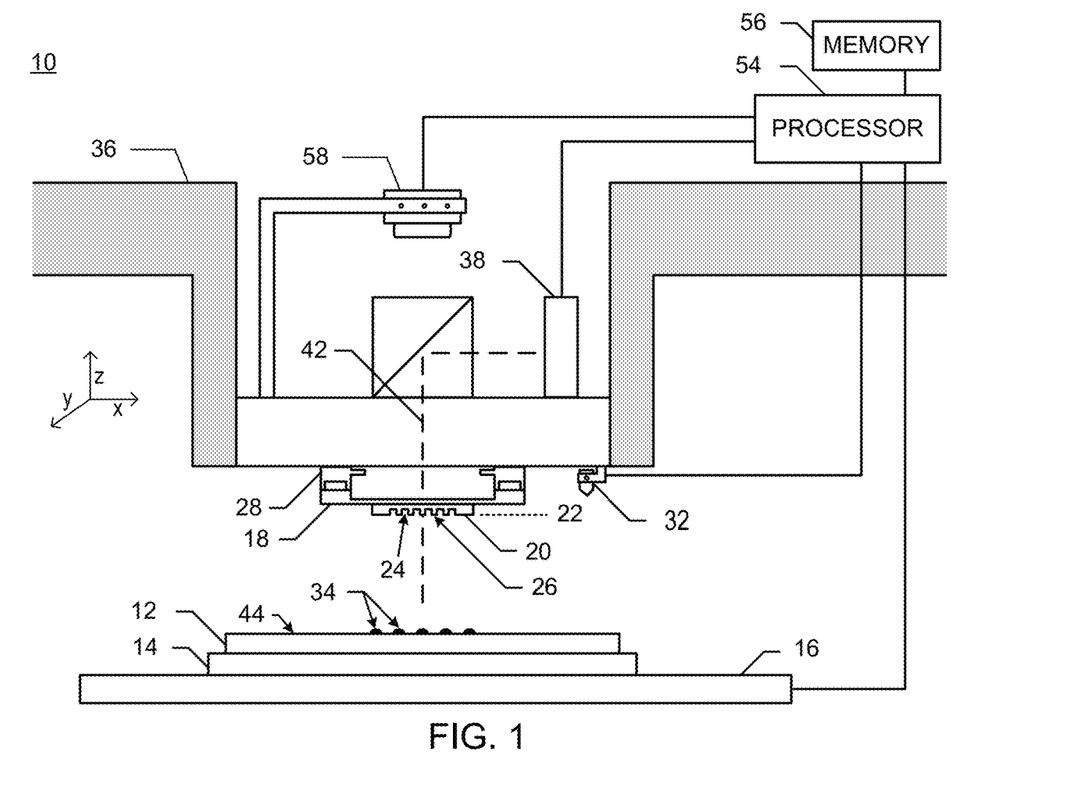
FIG. 1 is an illustration of a nanoimprint lithography system having a template and a mold spaced apart from a substrate.

FIG. 1 is an illustration of a nanoimprint lithography system 10 in which an embodiment may be implemented. The nanoimprint lithography system 10 is used to form a relief pattern on a substrate 12. Substrate 12 may be coupled to a substrate chuck 14. Substrate chuck 14 may be but is not limited to a vacuum chuck, pin-type, groove-type, electrostatic, electromagnetic, and/or the like.

Substrate 12 and substrate chuck 14 may be further supported by a positioning stage 16. Stage 16 may provide translational and/or rotational motion along one or more of the x, y, z, θ, and φ-axes. Stage 16, substrate 12, and substrate chuck 14 may also be positioned on a base (not shown).

Spaced-apart from the substrate 12 is a template 18. Template 18 may include a body having a mesa (also referred to as a mold) 20 extending towards the substrate 12. Mesa 20 may have a patterning surface 22 thereon. Alternatively, template 18 may be formed without mesa 20, in which case the surface of the template facing the substrate 12 is equivalent to the mold 20 and the patterning surface 22 is that surface of the template facing the substrate 12.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. The patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on the substrate 12.

Template 18 may be coupled to a template chuck 28. The template chuck 28 may be, but is not limited to, vacuum, pin-type, groove-type, electrostatic, electromagnetic, and/or other similar chuck types. Further, template chuck 28 may be coupled to imprint head 30 which in turn may be moveably coupled to a bridge 36 such that template chuck 28, imprint head 30, and template 18 are moveable in at least the z-axis direction, and potentially other directions.

Nanoimprint lithography system 10 may further comprise a fluid dispensing system 32. The fluid dispensing system 32 may be used to deposit formable material 34 (e.g., polymerizable material) onto the substrate 12. Additional formable material 34 may also be positioned upon substrate 12 using techniques, such as, drop dispense, spin-coating, dip coating, chemical vapor deposition (CVD), physical vapor deposition (PVD), thin film deposition, thick film deposition, and/or the like. The formable material 34 may be dispensed upon the substrate 12 before and/or after a desired volume is defined between the mold 22 and the substrate 12 depending on design considerations. The formable material 34 may comprise a mixture including a monomer as described in U.S. Pat. Nos. 7,157,036 and 8,076,386, both of which are herein incorporated by reference.

The nanoimprint lithography system 10 may further comprise energy source 38 that directs energy along path 42. Imprint head and stage 16 may be configured to position template 18 and substrate 12 in superimposition with a path 42. Camera 58 may likewise be positioned in superimposition with path 42. Nanoimprint lithography system 10 may be regulated by a processor 54 (controller) in communication with the stage 16, imprint head, fluid dispensing system 32, source 38, and/or camera 58 and may operate based on instructions in a computer readable program stored in a non-transitory computer readable memory 56 (medium). The processor 54 may be or include one or more of a CPU, MPU, GPU, ASIC, FPGA, DSP, and a general purpose computer. The processor 54 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected computer readable storage device, and an internet connected computer readable storage device.

Figure 2:
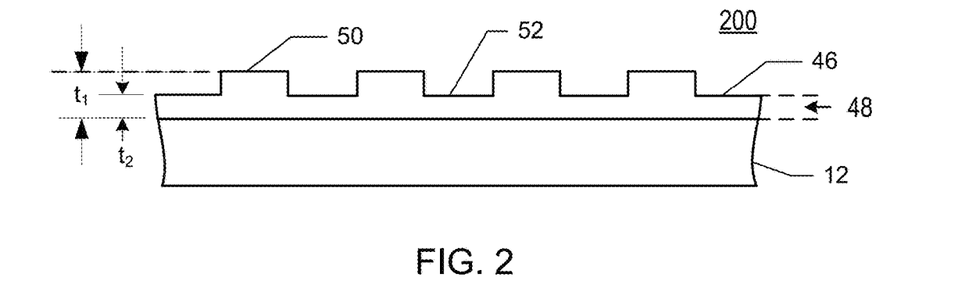
FIG. 2 is an illustration of a substrate with a solidified patterned layer formed upon it.

Either the imprint head, the stage 16, or both varies a distance between the mold 20 and the substrate 12 to define a desired volume that is filled by the formable material 34. For example, the imprint head may apply a force to the template 18 such that mold 20 is in contact with the formable material 34. After the desired volume is filled with formable material 34, source 38 produces energy 40, e.g., ultraviolet radiation, causing formable material 34 to solidify and/or cross-link conforming to a shape of surface 44 of substrate 12 and the patterning surface 22, defining a patterned layer 46 on substrate 12 as illustrated in FIG. 2. Patterned layer 46 may comprise a residual layer 48 and a plurality of features shown as protrusions 50 and recessions 52, with protrusions 50 having a thickness $t_1$ and residual layer having a thickness $t_2$ as illustrated in FIG. 2. Thicknesses $t_1$ and $t_2$ may vary across the substrate 12.

Different fluid dispense systems may use different technologies to dispense liquid materials. In the field of inkjet dispensing, for example, thermal ink jetting, microelectromechanical systems (MEMS) based ink jetting, and piezoelectric ink jetting are common techniques for dispensing ink.

In the thermal inkjet process, the print cartridges consist of a series of tiny chambers, each containing a heater. To eject a droplet from each chamber, a pulse of current is passed through the heating element causing a rapid vaporization of the ink in the chamber and forming a bubble, which causes a large pressure increase, propelling a droplet of ink onto the paper.

In the piezoelectric inkjet process a piezoelectric material is behind each nozzle instead of a heating element. When a voltage is applied, the piezoelectric material changes shape, generating a pressure pulse in the fluid, which forces a droplet of ink from the nozzle. Piezoelectric (also called Piezo) inkjet devices allow a wider variety of inks than thermal inkjet as there is no requirement for a volatile component, and less issues with residues. The MEMS based ink jetting process is substantially similar to piezoelectric inkjet process except the piezoelectric material is replaced with a MEMS device.

A Piezo based fluid dispensing system 32 may be used in the dispensing of the formable material 34 for a nanoimprint lithography application. In an alternative embodiment, instead of a Piezo based fluid dispensing system 32 a MEMS based fluid dispensing system is used. The viscosity of fluids typically dispensed with these systems can vary between 5 and 30 centipoise (cP). Other dispensing methods (such as thermal inkjet based) may also be used any of which allows formable material to be dispensed and then formed into a shape determined by the mold and the substrate.

The nanoimprint system includes an alignment system that is used to overlay the patterning surface 22 with an existing pattern on to a substrate 12 on a field by field basis. The mold 20 and the substrate 12 may both include alignment marks which are used as a feedback mechanism to identify the overlay between the two patterns. Because the formable material is placed on the substrate prior to the alignment process, a relatively small gap (for example on the order of 1 micron or less) exists during the overlay process. Therefore, the alignment system may need to focus two overlay marks from different planes onto the same focal plane. Such a requirement may not be critical for devices with features that are relatively large (e.g., greater than 100 nm). However, for critical features that are less than 100 nm, the images of the two overlay marks are best captured on the same focal plane or as close as possible in order to achieve high resolution overlay alignment.

One method for performing alignment uses Moiré patterns. Two layers of Moiré patterns which are not on the same plane overlap in an imaging system. Moiré patterns or fringes are the result of two superimposed periodic patterns with different periodicity. Light interference creates a Moiré pattern that has a larger pitch than either of the two overlapping patterns. A signal based on the Moiré pattern is then used to detect small shifts between the two periodic patterns. Control of the gap between the template and substrate within the depth of focus of the alignment system allows two layers of Moiré patterns to be simultaneously acquired.

Performing alignment may include correcting magnification and distortion errors during the overlay process. Any misalignment may be corrected by one or more actuators such as piezo actuators to adjust the position of the template 18. In an alternative embodiment, the actuators may be based on one or more effects including but not limited to: piezo-electrical effect; electro-magnetic effect, hydraulic effect, pneumatic effect, and capacitive effect.

Figure 3:
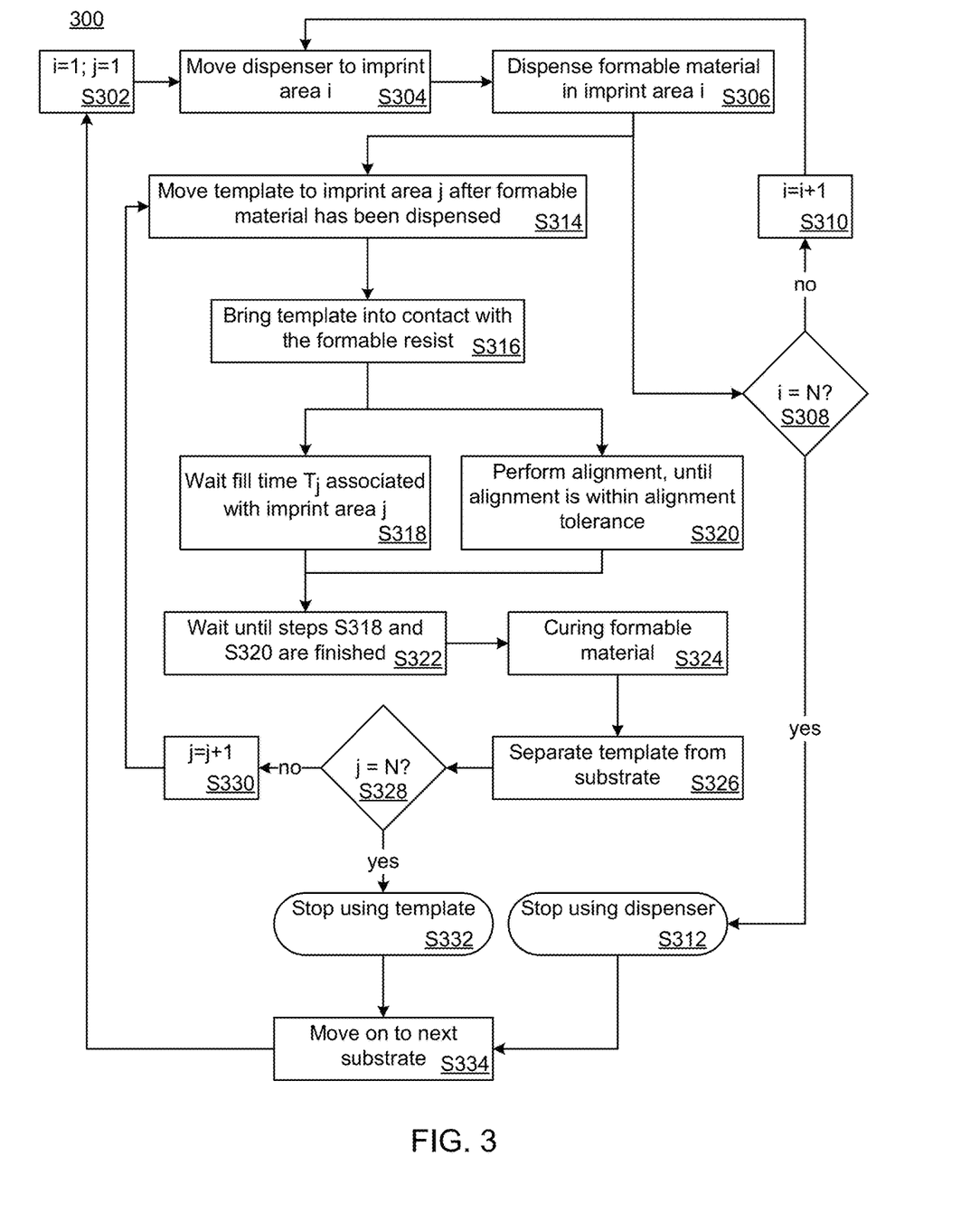
FIG. 3 is an illustration of an imprinting process as may be used in an exemplary embodiment.

The nanoimprint lithography process sequence consists of several steps which may be done both sequentially and in parallel. FIG. 3 is an illustration of an imprint process 300 according to an embodiment. The imprint process 300 may include a step S302 of setting indexes i and j to 1. The indexes i and j that represent each of the N imprint regions on the substrate 12. The substrate is divided into N imprint regions, which may be imprinted with the template 18 sequentially. The imprint process 300 may include a step S304 of moving the dispenser 32 to an imprint region i. In an alternative embodiment, the substrate 12 may be moved instead of the dispenser 32. In an alternative embodiment, moving the dispenser may include moving both the dispenser 32 and/or the substrate 12. The imprint process 300 may include a step S306 of dispensing the formable material 34 onto the substrate 12. The imprint process 300 may include a step S308 of a processor 54 checking if the index i is equal to N. If the index i is equal to N then the process 300 moves onto step S312 and the dispenser 32 is no longer used on the substrate 12 being processed. If the index i is not equal to N then the process 300 moves onto step S310 and the index i is incremented by one and the process 300 moves back to step S304.

The imprint process 300 may include a step S314 of moving 18 template to imprint area j after formable material 34 has been dispensed to imprint area j during step S306. The imprint process 300 may include a step S316 of bringing the template 18 into contact with the formable material 34. Once the template 18 has been brought into contact with the formable material 34, in a step S318 the processor 54 starts a clock to check the time against a fill time $T_j$ stored in memory 56 that is associated with the imprint area j. The fill time $T_j$ may be a premeasured period of time which indicates the period of time it takes to fill the template recesses and protrusions. A step S320 is also performed at the same time as step S318. During step S320 the template 18 is aligned with the substrate 12. In an embodiment, the alignment process may begin as the template 18 is being brought into contact with the formable material 34 but before the template 18 is in contact with the formable material. The processor 54 may be used determine when step S320 is considered finished by checking a measurement of the alignment against an alignment tolerance threshold. The alignment tolerance threshold may include one or more specified limits. The specified limits may be a function of previous processing steps and future processing steps, and the process drift inherent in the alignment system. The specified limits ensure that any new structures created with the imprint process are aligned with pre-existing structures on the substrate and/or future structures that may be added to the substrate. Step S320 may be considered finished once the measured alignment meets the alignment tolerance threshold or better. Measuring the alignment may include measuring one or more overlays of alignment marks in both the substrate 12 and the template 18, and also correcting for any distortion and magnification errors. A single overlay of a substrate alignment mark and a template alignment mark may be used to provide alignment data across all six axes (x, y, z, $\theta$, $\phi$, and $\psi$). Alternatively, multiple overlays may be used, wherein each overlay provides alignment data for one more of the six axes (x, y, z, $\theta$, $\phi$, and $\psi$).

The processor 54 may determine when both steps S318 and S320 are finished, only after both steps S318 and S320 are finished does the process 300 move on to step S324. During step S324 the formable material 34 is cured. The formable material may be cured by a process that causes the formable material 34 to polymerize and crosslink. The curing process may include exposing the formable material 34 to actinic radiation (e.g. UV light) from the source 38. In an alternative embodiment, the curing process may include one or more of pressing, heating, cooling, radiation, etc. After the formable material 34 has substantially cured, the template 18 separates from cured formable material in a step S236. Substantially cured in the present context means that at least an outer surface of the formable material has transitioned from a liquid phase to a solid phase.

In a step S328 the processor 54 will check to see if index j is equal to N. If index j is equal to N then the process 300 moves onto step S332. If index j is not equal to N then the process 300 moves onto step S330 the index j is incremented and the process moves back to step S314. In step S332 all of the imprint areas on the substrate 12 have been imprinted so the process goes onto step S334 in which the substrate 12 is removed from the imprinting tool and a new substrate 12 begins the process. The process 300 may then move back to step S302.

The fill time $T_j$ is typically comprised of two components: 1) the time it takes for drops to coalesce; and 2) the time it takes for the trapped gas volume formed between coalesced drops to dissipate. For a given targeted residual layer thickness $t_2$, a specific volume of formable material must be applied from a fluid dispensing system 32. If a small drop volume is used, the drops will spread laterally, and reach a point where the drops begin to coalesce, thereby leaving a small volume of trapped gas between the drops. If the trapped gas does not dissipate before the cure step S324 then a defect will occur. The trapped gas will have dissipated once all of the spaced apart recesses 24 and/or protrusions 26 are filled with the formable material 34. The larger the amount of trapped gas, the longer it will take to fill all recesses 24 and/or protrusions 26.

Figure 4:
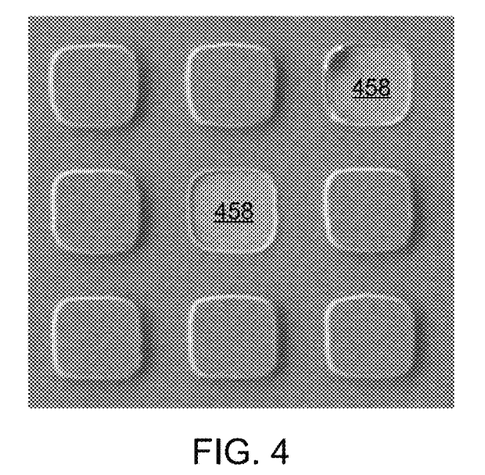
FIG. 4 is an illustration of a result of an exemplary embodiment.
Figure 9A:
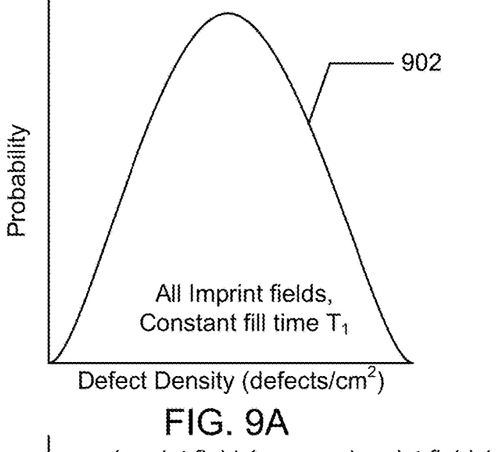
FIGS. 9A-F are probability distributions that illustrate general trends in statistical behavior of embodiments.
Figure 9B:
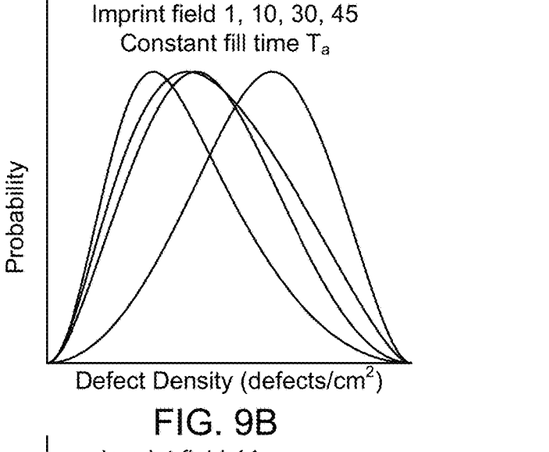
Figure 9C:
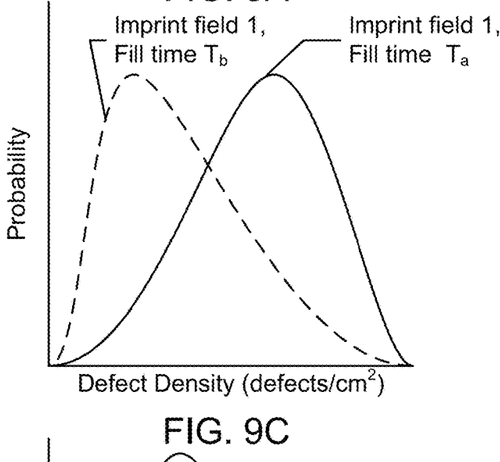
Figure 9D:
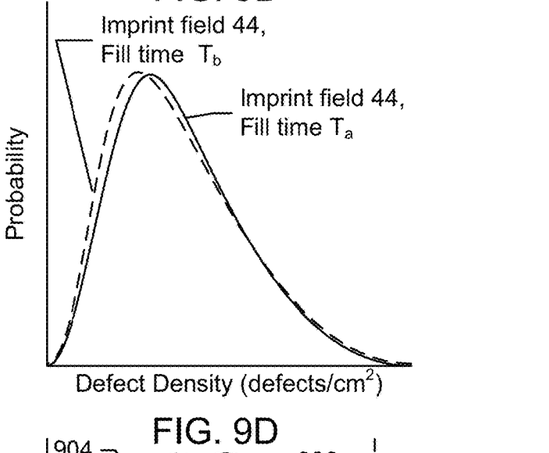
Figure 9E:
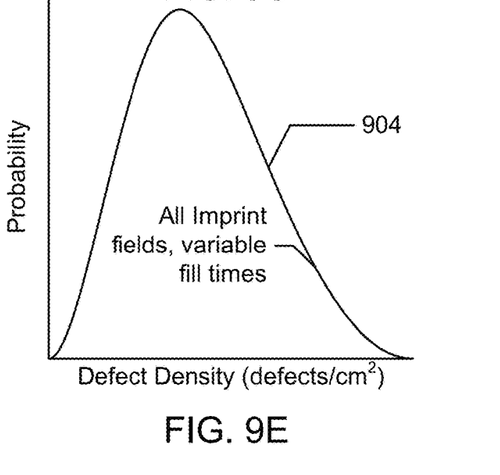
Figure 9F:
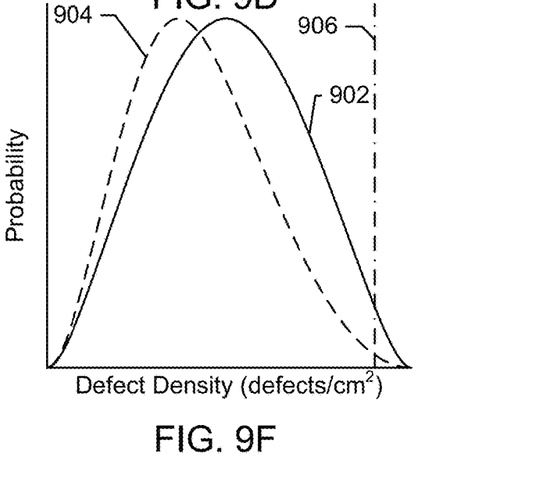

Defectivity, as it relates to formable material filling is defined as areas in which the spaced apart recesses 24 and/or protrusions 26 are not filled by the formable material 34. This defect mode may be referred to as a non-fill defect. Simple examples of non-fill defects 458 are illustrated in FIG. 4. Formable material fill time, is typically defined by the time it takes to reach a desired minimum number of non-fill defects in a nanoimprint process. A typical value is between zero and one non-fill defects per square centimeter. The defectivity was measured across multiple imprints and multiple wafers, in which each imprint was held for a static fill time $T_a$. These defectivity measurements are represented by a total defectivity distribution 902 as illustrated in FIG. 9A. This defectivity distribution may vary across fields as illustrated in FIG. 9B in which defectivity distributions for a variety of imprint fields are shown. The defectivity distribution is heterogeneous across imprint fields. The applicant has found that for some fields increasing the fill time to a fill time $T_b$ has a significant impact on the defectivity distribution as illustrated in FIG. 9C. While increasing the fill time to a fill time $T_b$ for a different field has a smaller impact (or zero impact) on the defectivity distribution as illustrated in FIG. 9D. The applicant has found that if the fill time is adjusted for each imprint field than a defectivity distribution 904 can be achieved which has a higher yield than defectivity distribution 902. FIG. 9F shows a comparison of defectivity distribution 902, defectivity distribution 904, and yield line 906. Imprints with defects density's below the yield line may be considered acceptable while Imprints with defect densities above the yield line may be considered to be unacceptable imprints. FIGS. 9A-F illustrate general trends and are for illustrative purposes, are representative of the overall behavior of the defectivity distributions and how changing parameters, and imprint fields can change these distributions.

Figure 8A:
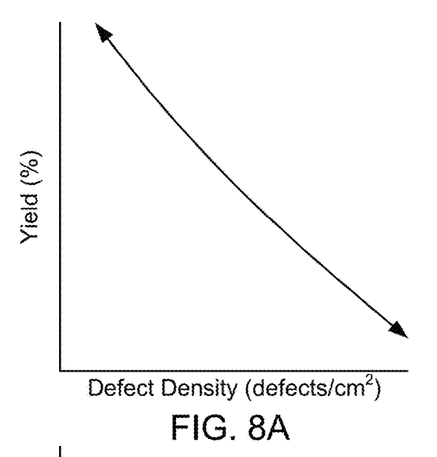
FIGS. 8A-F are illustrations of general trends relating yield, throughput, convergence and imprint control parameters used in an exemplary embodiment.
Figure 8B:
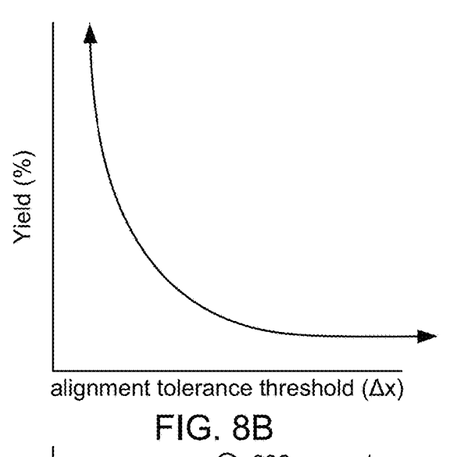

Reducing the overall defect density means reducing the amount of defects that are above the yield line 906, which also increases the yield as illustrated in FIG. 8A. The yield can also be sensitive to the alignment tolerance threshold as illustrated in FIG. 8B. As the alignment tolerance threshold decreases, the yield increases. In a closed loop alignment system, decreasing the alignment tolerance threshold increases the time needed for alignment. An alternative embodiment, may include an open loop alignment system, in which a fixed alignment time is set. In an open loop alignment system, for a given imprint, the alignment will converge before or after the fixed alignment time. FIG. 8D is an illustration of the probability for a given alignment time that a particular imprint has converged. A fixed alignment time 806 may then be chosen in which most of the imprints have converged. In addition, as the alignment time increases, throughput decreases. The ability of the imprint process to add value is function of a multiple of both yield and throughput. Therefore, there is sweet spot for alignment tolerance threshold which provides the most value for the imprint process.

Figure 8C:
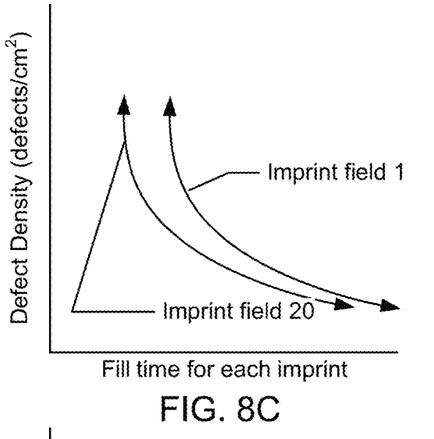
Figure 8D:
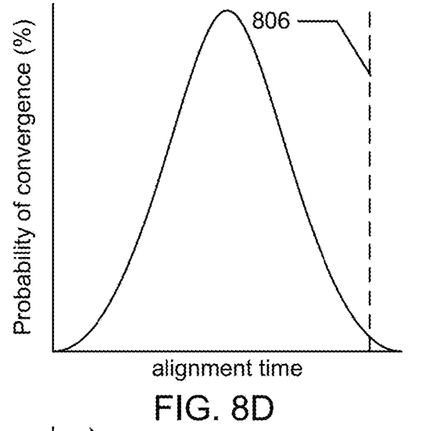

The applicant has found that increasing the fill time reduces the total defect density as illustrated in FIG. 8C. The applicant has also found that for a given imprint field the amount of improvement in the defect density for a given increase in the fill time varies. FIG. 8C illustrates the difference in increases for imprint field 1 and imprint field 20. As with the alignment time, increasing the fill time decreases the throughput. As discussed above, there is a sweet spot for the total fill time. The total fill time is the sum of the fill time for all of the imprints on the substrate. The applicant has found that each imprint field on a substrate has a different relationship between fill time and defect density. Depending on the imprint field increasing the fill time to be greater than the alignment time can have a large or small effect on the yield.

In a non-optimal imprint process the formable material fill time (S318) may require on the order of several seconds to tens of seconds. While the time required to perform alignment (S320) was less than the fill time. In a process in which performing alignment in step S320 occurs in parallel with the fill step S318, the process was limited by the fill time. However, as the imprinting process has improved fill times of less than one second are now possible.

Figure 8E:
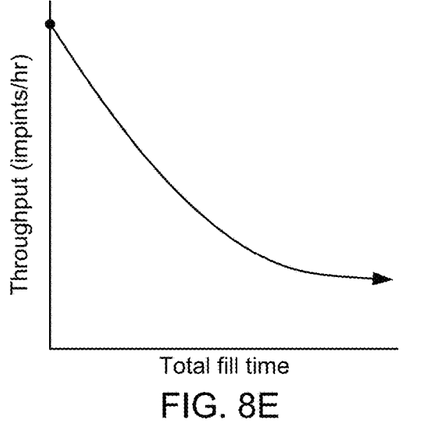
Figure 8F:
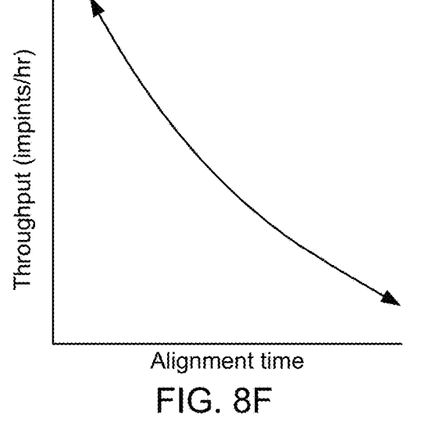

The nanoimprint process is performed in a step and repeat manner. In the step and repeat manner of imprinting the nanoimprint process is performed in a plurality of imprint fields spread across the substrate 12. In the prior art one goal was to reduce the time required to perform each imprint which includes reducing the fill time for each imprint. What is also needed is a way to reduce the total time spent performing imprint on all the imprint fields of the substrate, and/or the total time spent allowing the formable material 34 to fill voids and allow gas bubbles in the imprinting field to dissipate out of the imprint field. Reducing the alignment time and/or the fill time increases the throughput as illustrated in FIGS. 8E-F. FIGS. 8A-F illustrate general trends and are for illustrative purposes of how adjusting process parameters has an effect on the imprint process.

Devices with features which are less than 100 nm may require a tight overlay between patterning levels in order to correctly function. For a typical pattern layout across a 300 mm substrate many tens of fields may be required to pattern the entire substrate. For example in FIG. 5, a pattern layout of eighty-four 26 mm×33 mm imprint fields is needed to populate the entire 300 mm substrate 12. As the size of the imprint field is reduced, the number of imprint fields increases accordingly. The number of imprint fields can be as high as several hundreds, with more typical values ranging between 84 and 150.

Figure 5:
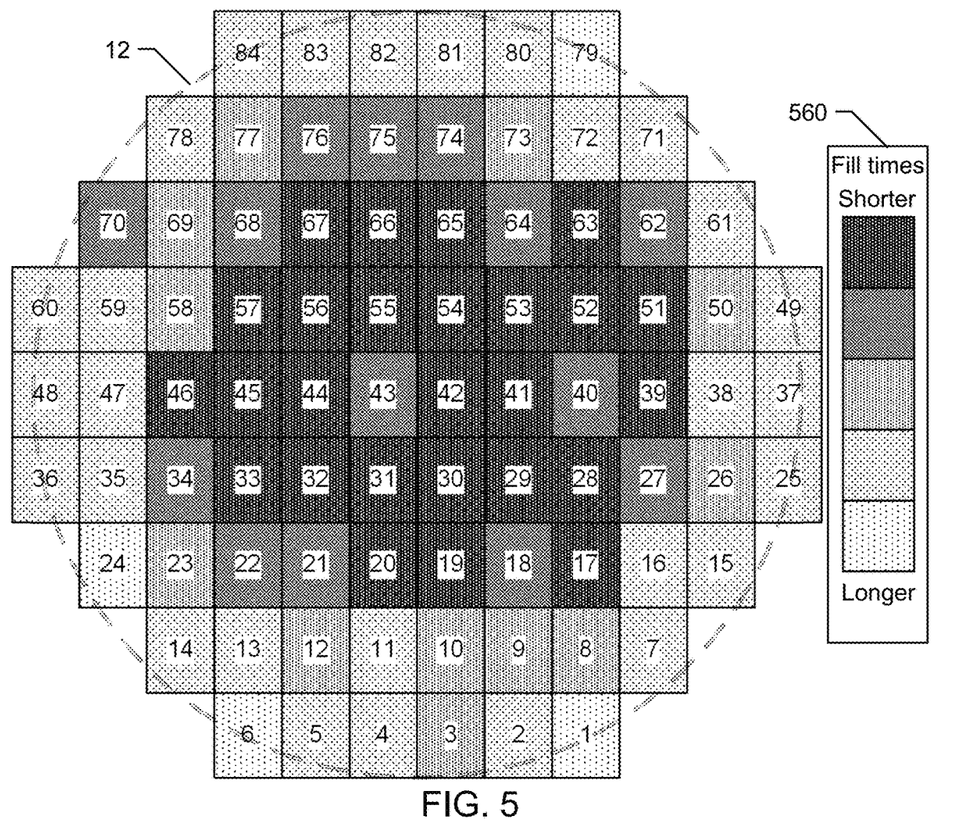
FIG. 5 is a filling time map as might be produced in an exemplary embodiment.

Not every imprint shown in FIG. 5 is a full field imprint. The imprint fields are square or rectangular, while the substrate is typically circular. Therefore, the imprint fields on the edges either overlap the edges of the substrate as illustrated FIG. 5 or some areas of the substrate are not imprinted, which may be considered a waste of substrate and is typically avoided. The entire substrate may also be imprinted to improve subsequent processes. A full field imprint may be defined as an imprint field that is large enough to transfer an entire pattern and in which the entire pattern is imprinted. Some of the imprinted fields are not full fields and are instead partial fields. A partial field may be defined as an imprint field which does not require the entire pattern of the template to be transferred onto the substrate 12. In FIG. 5, twenty-six of the eighty-four fields are partial fields. As the number of imprinted fields decreases, the ratio of partial fields to total fields increases.

Partial fields, present additional challenges, especially with respect to formable material fill time. For a full field, a nanoimprint system may induce the start of the formable material fill process at the center of the field and have the formable material fill radially outwards. In contrast, partial fields cannot always relying on filling in this manner, and fill time may increase. The fluid fill time T for each imprint field is dictated by the longest fill time $T_{max}$ taking all of the imprint fields on the substrate 12.

The fill time variation for a typical substrate 12 is illustrated in FIG. 5, in which each field is numbered 1-84. The maximum fill time for each field was measured across several substrates. In FIG. 5 a relative amount of fill time is signified by fill patterns which are also shown in their relative order in legend 560. As illustrated in FIG. 5, the typical partial field takes longer to fill then the typical full field. While there also remains some variation in the fill time for each full field.

Figure 6:
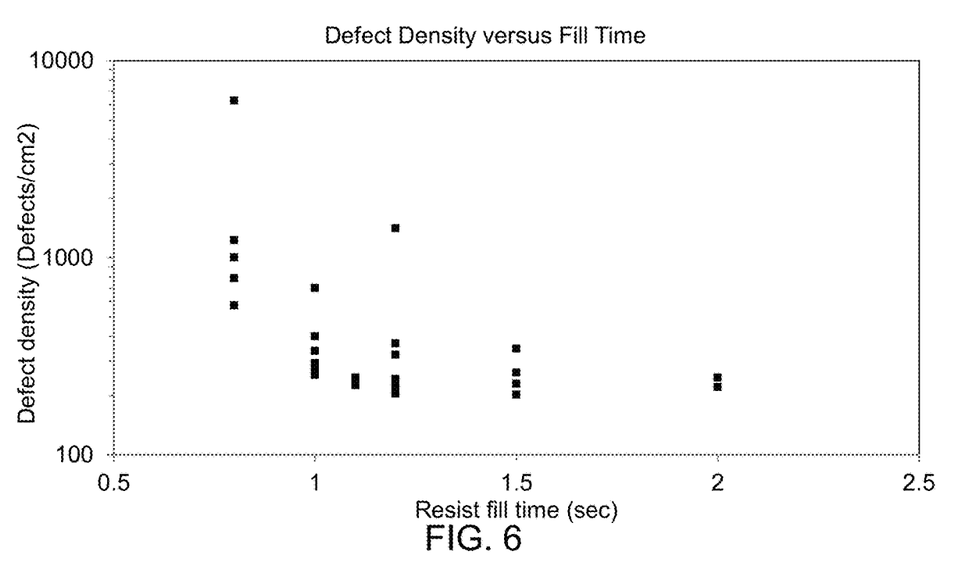
FIG. 6 is an illustration of defect data as might be produced in an exemplary embodiment.

FIG. 6 is an illustration of how formable material fluid fill time effects the distribution of non-fill defect density, measured in defects per square centimeter. For a given formable material fill time, several imprint field defect densities are plotted. Some of the imprint fields are full imprint fields, others are full fields located near the substrate edge, while others are partial imprint fields. As apparent from FIG. 6, for any given formable material fluid fill time, there is a range of non-fill defect densities. This may be caused by the challenges in filling both partial imprint fields as well as full imprint fields located near the substrate edge. In order to meet a predetermined non-fill defect density criteria, formable material fluid fill time $T_{max}$ is chosen to ensure that even the slowest filling imprint field satisfies the predetermined non-fill defect density criteria.

In addition to field layout, fill time may not necessarily be the same for all feature patterns. For example, vertical line space patterns may fill faster in one direction. In addition, sparse pillar patterns may fill slower. Formable material droplets that have placed further apart may require longer fill times for droplet coalescence and trapped gas dissipation.

Further complicating improving throughput is a parallel step S320 in which alignment is performed. Alignment may include aligning one or more alignment marks on a substrate 12 with one or more alignment marks on the template 18. Alignment time, similar to formable material fill time, is defined as the time it takes an alignment signal, such as a Moiré signal, to converge to a desired value. Alignment convergence errors can range between 0.10 nanometer and 30 nanometers, with more typical values being between 0.5 and 3 nm.

Alignment convergence time, similar to formable material fill time, can vary from field to field for various reasons. One of the reasons for the variation is the detection of the area of the alignment mark typically identified by a separate region of interest (ROI) mark located near the alignment mark. If the ROI mark error is large, then the time for alignment convergence may be large. As a general rule, the larger the offset between the two Moiré alignment marks on the template and the substrate, the longer the alignment convergence time.

The applicant has found that, alignment convergence tends to take longer for partial fields or full fields close to the edge of the substrate. An issue that may have an impact on the speed of alignment convergence is the deviation between a model of the system and the reality of the system. The model of the system for example may be a numerical or analytical representation of the template, the substrate, and the apparatus which controls their movement. The model of the system may provide estimates of how the template and the substrate move relative to each other in response to different motor controls. The ability of the model of the system to accurately reflect reality may decrease the farther template is away from the center of the substrate. For instance, the greater the distance between the template and the center of the substrate, the greater the effect that an initial alignment of alignment marks may be to any deviation in the relative rotation (also tilt and yaw) of the template 18 to the substrate 12. Thus, imprint fields towards a center of the substrate 12 tend to have small rotation errors and faster alignment convergence times, whereas full fields near the edge of the substrate or partial fields at the edge of the substrate have larger rotation errors and slower alignment convergence times.

Figure 7A:
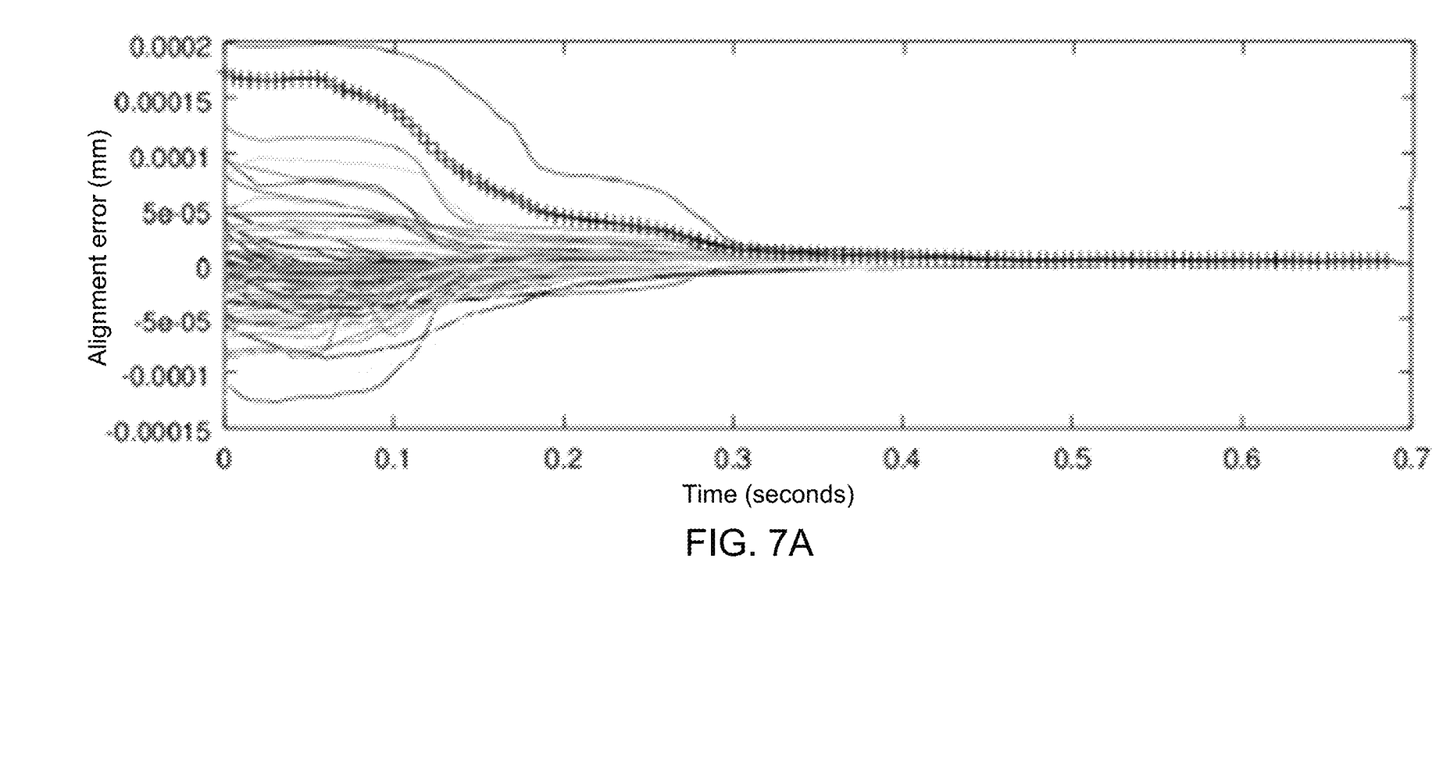
FIGS. 7A-B are illustrations of alignment error data as might be produced in an exemplary embodiment.
Figure 7B:
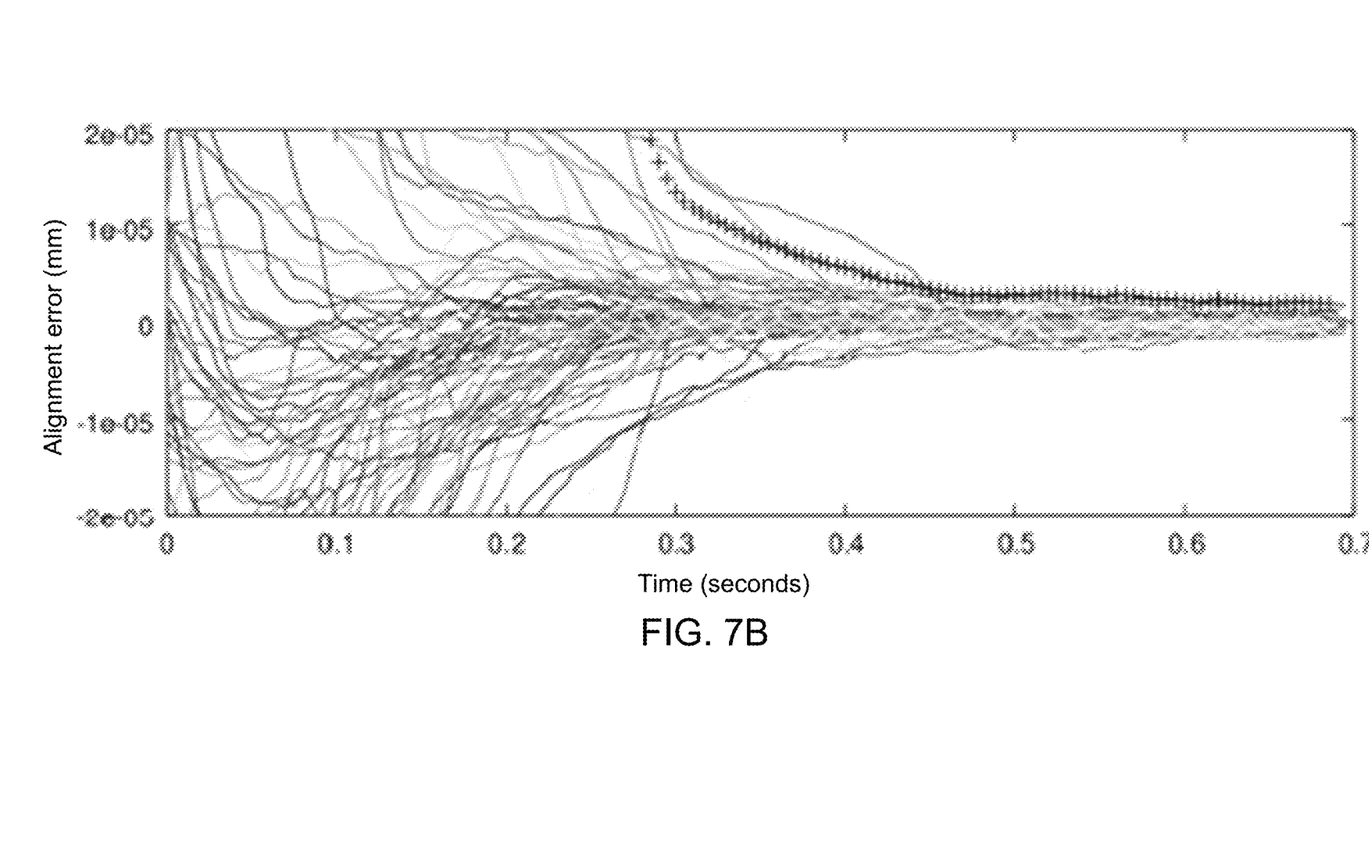

FIGS. 7A-B are illustrations of some convergence curves for numerous imprint fields illustrating the alignment error as a function of time. Note that in each case: the initial offset in the alignment signal is different for each field; the slope of each convergence curve is also different; and that each plot reaches the desired convergence value $y_0$ at a different point in time.

Typical alignment convergence times can range from 0.10 seconds to up to 10 seconds, with more typical values being 0.30 seconds to 2.0 seconds. As a result, it is possible for some imprint fields to have the minimum time necessary to accomplish both formable material fluid fill and alignment convergence dictated by the formable material fluid fill time. In other cases, it is possible for some imprint fields to have the minimum time necessary to accomplish both formable material fluid fill and alignment convergence dictated by alignment convergence time.

Prior art methods have chosen a time ($T_{max}$), based on the maximum anticipated value of both fluid fill time and alignment convergence time. This method, however, is inefficient, in that many fields are ready for the UV exposure of the formable material before time $T_{max}$. The choice of a large $T_{max}$ slows down the imprinting process, thereby decreasing the throughput. Slower throughputs have a negative impact on device cost and amortization of the imprinting equipment.

In one exemplary embodiment, fill times for each imprint field are not actively measured but are set for each imprint field location or groups of imprint field locations based on experimental data. Experimental data may include but is not limited to the defect density based on previous imprints. Defect density may be gathered using test wafers. Test wafers may be imprinted with a variety of fill times.

The applicants have identified, a new method (FIG. 3) that identifies a minimum time needed for both formable material fluid fill and alignment convergence. This new method may overcome the adverse effects of fill time based on a maximum fill time, by gathering information from send-ahead substrates which are used to characterize formable material fluid fill time for every field or group of fields and then doing a real time analysis of convergence time on a field by field basis.

In an exemplary embodiment, one or more (1, 2, 4, 10, 100, etc.) send-ahead substrates are patterned using nanoimprint system 10, with a plurality of different fill times and are then inspected for non-fill defects. Each imprint field is then assigned that the shortest fill time that meets the defect density criteria. In one embodiment, four different fill times are evaluated, another number of fill times (such as 2, 5, 10, 12, etc.) may also be used. A map these fill times may take the form of the wafer map illustrate in FIG. 5.

An embodiment may including constantly or on an occasional basis analyzing the formable material on the substrate after the formable material has been cured to determine the defect density for each of the plurality of locations. In an embodiment, the template filing time is increased at a particular location among the plurality of locations if the defect density for the particular location is above a first threshold. In an embodiment, the template filing time is decreased at a particular location among the plurality of locations if the defect density for the particular location is below a second threshold. In an embodiment, the template filing time is adjusted at a particular location among the plurality of locations if the defect density for the particular location is outside a first range.

Different formable material fill times may be designated for each individual field or a groups of fields, based on previous imprinting experience. Different fill times may also be designated based on the distance from the center of the substrate or distance from the edge of the substrate. A lookup table may be created which lists the imprint field location and the fill time associated with each imprint field.

Nanoimprint lithography techniques are not limited to the exemplary nanoimprint techniques such as U.S. Pat. Nos. 8,349,241, 8,066,930, and 6,936,194, all of which are hereby incorporated by reference herein. Other nanoimprint techniques including UV nanoimprint lithography and thermal nanoimprint lithography may also be used in an embodiment.

In an embodiment, interference based Moiré alignment systems may be used to achieve alignment convergence. Other alignment systems, including phase gratings, bright-field, dark-field, diffractive, on-axis and off-axis systems may also be employed to determine the alignment convergence.

Systems commonly used for the detection of non-fill defects can include bright-field patterned substrate inspection tools, such as the KLA-Tencor 2900 series broadband plasma defect inspection system. Other possible inspection systems include dark-field optical patterned substrate inspection systems, laser scanning patterned substrate inspectors and electron beam based substrate inspection systems.

Articles which may be fabricated by an embodiment include but are not limited for the semiconductor industry include integrated devices made on a silicon substrate such as CMOS logic, microprocessors, NAND Flash memory, NOR Flash memory, DRAM memory, or other memory devices such as MRAM, 3D cross-point memory, Re-RAM, Fe-RAM, STT-RAM, and the like.

Substrates materials include but are not limited to silicon, glass, fused silica, GaAs, GaN, InP, Sapphire, AlTiC, as well as other substrates well known in the art. Devices, fabricated on these substrates include patterned media, field effect transistor devices, heterostructure field effect transistors, light emitting diodes, read/write heads for the hard drive industry and the like.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. An imprinting method comprising:
applying a formable material to a substrate;
imprinting a template onto the formable material at a plurality of locations on the substrate,
wherein a template filling time varies among the plurality of locations on the substrate;
wherein the template filling time is an amount of time allotted for formable material to fill the template for each of the plurality of locations on the substrate during imprinting each of the plurality of locations;
wherein a processor is configured to determine the template filling time;
wherein the template filling time for each of the plurality of locations is determined prior to applying the formable material to the substrate;
wherein the template is aligned to the substrate each time the template is imprinted onto the formable material during an alignment convergence period;
wherein the alignment convergence period is determined to have completed when real time alignment data indicates that alignment of the template and the substrate is within specified acceptable limits;
wherein the alignment convergence period and the template filling time overlap; and
curing the formable material in the template at each of the plurality of locations after both the alignment convergence period has completed and the template filling time has expired.

2. The imprinting method according to claim 1, wherein the substrate is a wafer.

3. The imprinting method according to claim 1, wherein curing the formable material includes exposing the formable material to actinic radiation.

4. The imprinting method according to claim 1, further comprising:
analyzing the formable material on the substrate after the formable material has been cured to determine the defect density for each of the plurality of locations.

5. The imprinting method according to claim 4, further comprising:
increasing the template filling time at a particular location among the plurality of locations if the defect density for the particular location is above a first threshold.

6. The imprinting method according to claim 4, further comprising:
decreasing the template filling time at a particular location among the plurality of locations if the defect density for the particular location is below a second threshold.

7. The imprinting method according to claim 4, further comprising:
adjusting the template time at a particular location among the plurality of locations if the defect density for the particular location is outside a first range.

8. The imprinting method according to claim 1, wherein the real time alignment data converges to values that are within the specified limits.

9. The imprinting method according to claim 1, wherein the real time alignment data includes values representative of each of three directional axes and three rotational axes.

10. The imprinting method according to claim 1, wherein the real time alignment data is reduced to a single magnitude.

11. The imprinting method according to claim 1, further comprising:

analyzing the formable material on the substrate after the formable material has been cured to determine the yield for each of the plurality of locations.

12. The imprinting method according to claim 11, further comprising:

adjusting the template filling time at a particular location among the plurality of locations such that a multiple of both a predicted yield and a predicted throughput is greater than a previous yield and a previous throughput.

13. The imprinting method according to claim 11, further comprising:

adjusting the template filling time at a particular location among the plurality of locations such that both a predicted yield is greater than a previous yield and a predicted throughput is greater than a previous throughput.

14. The imprinting method according to claim 1, further comprising:

measuring a defect density probability distribution, for each of a plurality of potential template filling times and for each of the plurality of locations;

choosing the template filling time for each of the plurality of locations from among the potential template filling times which is the shortest period that has an acceptable defect density probability distribution.

15. The imprinting method according to claim 1, further comprising:

imprinting one or more send-ahead substrates with a plurality of different template filling times;

inspecting each of the one or more send-ahead substrates for non-fill defects;

assigning, for each of the plurality of location, a shortest fill time that meets a defect density criteria.

16. A method of manufacturing an article with an imprinting apparatus comprising:

applying a formable material to a substrate;

imprinting a template onto the formable material at a plurality of locations on the substrate, wherein a template filling time varies among the plurality of locations on the substrate;

wherein the template filling time is an amount of time allotted for formable material to fill the template for each of the plurality of locations on the substrate during imprinting each of the plurality of locations;

wherein a processor is configured to determine the template filling time;

wherein the template filling time for each of the plurality of locations is determined prior to applying the formable material to the substrate;

wherein the template is aligned to the substrate each time the template is imprinted onto the formable material during an alignment convergence period;

wherein the alignment convergence period is determined to have completed when real time alignment data indicates that alignment of the template and the substrate is within specified limits;

wherein the alignment convergence period and the template overlap; and curing the formable material in the template at each of the plurality of locations after both the alignment convergence period has completed and the template filling time has expired.

17. An imprinting apparatus controller comprising:

a memory; and a processor configured to send instructions to an imprinting apparatus to:

apply a formable material to a substrate;

imprint a template onto the formable material at a plurality of locations on the substrate, wherein a template filling time varies among the plurality of locations on the substrate;

wherein the template filling time is an amount of time allotted for formable material to fill the template for each of the plurality of locations on the substrate during imprinting each of the plurality of locations;

wherein a processor is configured to determine the template filling time;

wherein the template filling time for each of the plurality of locations is determined prior to applying the formable material to the substrate and is stored in the memory;

wherein the template is aligned to the substrate each time the template is imprinted onto the formable material during an alignment convergence period;

wherein the alignment convergence period is determined to have completed when real time alignment data received by the processor indicates that alignment of the template and the substrate is within specified limits; and wherein the alignment convergence period and the template filling time overlap; and cure the formable material in the template at each of the plurality of locations after both the alignment convergence period has completed and template filling time has expired.

* * * * *